United States Patent
Cacho Alonso et al.

(10) Patent No.: US 10,765,035 B2
(45) Date of Patent: Sep. 1, 2020

(54) ELECTRICAL ENCLOSURE ASSEMBLY COMPRISING A COOLING DEVICE WHICH IS RECEIVED IN AN ELECTRICAL ENCLOSURE HOUSING

(71) Applicant: RITTAL GMBH & CO. KG, Herborn (DE)

(72) Inventors: Juan Carlos Cacho Alonso, Braunschweig (DE); Manfred Immel, Mittenaar (DE); Sandra Schwietz, Haiger (DE); Jan Meschkat, Hüttenberg (DE)

(73) Assignee: RITTAL GMBH & CO. KG, Herborn (DE)

( * ) Notice: Subject to any disclaimer, the term of this patent is extended or adjusted under 35 U.S.C. 154(b) by 0 days.

(21) Appl. No.: 16/094,984

(22) PCT Filed: Mar. 24, 2017

(86) PCT No.: PCT/DE2017/100242
§ 371 (c)(1),
(2) Date: Oct. 19, 2018

(87) PCT Pub. No.: WO2017/182025
PCT Pub. Date: Oct. 26, 2017

(65) Prior Publication Data
US 2019/0124786 A1 Apr. 25, 2019

(30) Foreign Application Priority Data
Apr. 22, 2016 (DE) .................. 10 2016 107 531

(51) Int. Cl.
*H05K 7/20* (2006.01)
*H05K 5/06* (2006.01)
*H02B 1/56* (2006.01)

(52) U.S. Cl.
CPC ............ *H05K 7/206* (2013.01); *H02B 1/565* (2013.01); *H05K 5/069* (2013.01); *H05K 7/20572* (2013.01); *H05K 7/20754* (2013.01)

(58) Field of Classification Search
CPC ............................................. H05K 7/20–2099
(Continued)

(56) References Cited

U.S. PATENT DOCUMENTS 4,763,859 A * 8/1988 Biagini .................. B64D 13/08
244/118.5
5,467,250 A 11/1995 Howard et al.
(Continued)

FOREIGN PATENT DOCUMENTS

DE 19917641 A1 8/2000
DE 10205653 C1 10/2003
(Continued)

OTHER PUBLICATIONS

International Search Report (in English and German) and Written Opinion (in German) issued in PCT/DE2017/100242, dated Jul. 7, 2017; ISA/EP.

*Primary Examiner* — Zachary Pape
(74) *Attorney, Agent, or Firm* — Harness, Dickey & Pierce, P.L.C.

(57) ABSTRACT

A control cabinet arrangement, comprising a cooling device which is received in a control cabinet housing, wherein the cooling device can be slidably held on the control cabinet housing via a linear adjusting unit, particularly a bar system, and can be adjusted between a pull-out position and a slide-in position, wherein the cooling device in the slide-in position is completely received in the control cabinet housing, and in the pull-out position, the cooling device protrudes at least partially beyond a door side of the control cabinet housing from the control cabinet housing, and wherein a door element, which closes in its closed position
(Continued)

the door side of the control cabinet housing, comprises at least one air passage opening which opens into an air outlet and/or an air inlet of the cooling device in the closed position of the door element, when the cooling device is in the slide-in position.

12 Claims, 11 Drawing Sheets

(58) Field of Classification Search
USPC .................. 361/679.46–679.54, 688–723
See application file for complete search history.

(56) References Cited

U.S. PATENT DOCUMENTS

| | | | |
|---|---|---|---|
| 6,164,369 A | 12/2000 | Stoller | |
| 6,463,997 B1* | 10/2002 | Nicolai | H02B 1/565 |
| | | | 165/80.2 |
| 6,788,535 B2* | 9/2004 | Dodgen | H05K 7/206 |
| | | | 165/104.33 |
| 6,948,324 B2* | 9/2005 | Jin | F25D 19/02 |
| | | | 62/298 |
| 7,775,061 B2* | 8/2010 | Dorrich | H05K 7/20572 |
| | | | 62/186 |
| 8,240,785 B2 | 8/2012 | Schell et al. | |
| 8,522,565 B1* | 9/2013 | Hauck | F25D 19/02 |
| | | | 62/115 |
| 10,076,060 B2 | 9/2018 | Cacho Alonso et al. | |
| 2009/0185348 A1* | 7/2009 | Bretschneider | H05K 7/20181 |
| | | | 361/695 |
| 2010/0083581 A1* | 4/2010 | Mattice | B66B 13/308 |
| | | | 49/475.1 |
| 2011/0063778 A1* | 3/2011 | Brouillard | H05K 7/20645 |
| | | | 361/678 |
| 2011/0072835 A1* | 3/2011 | Nicolai | H05K 7/20581 |
| | | | 62/3.2 |
| 2012/0085122 A1* | 4/2012 | Thour | H05K 7/206 |
| | | | 62/419 |
| 2015/0087222 A1 | 3/2015 | Li et al. | |
| 2017/0202109 A1 | 7/2017 | Cacho Alonso et al. | |
| 2017/0288239 A1* | 10/2017 | Wilkie | H05K 7/20572 |
| 2017/0325354 A1* | 11/2017 | Lee | H05K 7/18 |
| 2018/0098456 A1* | 4/2018 | Schreier | H05K 7/206 |
| 2018/0132379 A1 | 5/2018 | Cacho Alonso et al. | |
| 2018/0139870 A1* | 5/2018 | Meadows | F25B 39/00 |

FOREIGN PATENT DOCUMENTS

| | | |
|---|---|---|
| DE | 102006058779 A1 | 6/2008 |
| DE | 202008003516 U1 | 7/2008 |
| DE | 102008002789 A1 | 9/2009 |
| WO | WO-2012/116727 A1 | 9/2012 |

\* cited by examiner

ELECTRICAL ENCLOSURE ASSEMBLY COMPRISING A COOLING DEVICE WHICH IS RECEIVED IN AN ELECTRICAL ENCLOSURE HOUSING

CROSS-REFERENCE TO RELATED APPLICATIONS

This application is a 371 U.S. National Stage of International Application No. PCT/DE2017/100242, filed on Mar. 24, 2017, which claims priority to German Application No. 10 2016 107 531.0, filed on Apr. 22, 2016. The entire disclosures of the above applications are incorporated herein by reference.

BACKGROUND

This section provides background information related to the present disclosure which is not necessarily prior art.

TECHNICAL FIELD

The invention relates to a control cabinet arrangement, comprising a cooling device which is received in a control cabinet housing, wherein the cooling device can be slidably held on the control cabinet housing via a linear adjusting unit, particularly a bar system, and can be adjusted between a pull-out position and a slide-in position, wherein the cooling device in the slide-in position is completely received in the control cabinet housing, and in the pull-out position, the cooling device protrudes at least partially beyond a door side of the control cabinet housing from the control cabinet housing.

DISCUSSION

Such a control cabinet arrangement is known from DE 20 2008 003 516 U1. The cooling device has a Peltier element and can be inserted into the control cabinet housing via bars provided on opposite sidewalls of the control cabinet. For the recooling of the warm side of the Peltier element, an air passage opening is formed on the rear wall of the control cabinet housing which opens into a warm air outlet opening of the Peltier cooling device.

Due to their use of Peltier elements as active cooling agent, the cooling devices known from the prior art are disadvantageous because they only provide comparatively low cooling capacity and thus frequently cannot meet the cooling capacity requirement for many IT applications and applications in the field of power electronics.

SUMMARY

This section provides a general summary of the disclosure, and is not a comprehensive disclosure of its full scope or all of its features.

The invention thus addresses the problem of developing the known control cabinet arrangement such that it is also applicable in connection with cooling devices of higher performance classes, particularly in connection with refrigerating machines.

Accordingly, a door element, which closes in its closed position the door side of the control cabinet housing, comprises at least one air passage opening which opens into an air outlet and/or an air inlet of the cooling device in the closed position of the door element, when the cooling device is in the slide-in position. The door element can have separate air passage openings, of which a first air passage opening opens into the air outlet and a second air passage opening opens into the air inlet.

Since the air passage opening in the control cabinet arrangement according to the invention is provided on a front-side door element of the control cabinet housing, it is ensured that a sufficient air volume can be provided via the air passage opening for the recooling, for example, of a condenser of a refrigerating machine. In particular, when control cabinet arrangements of the type in question are placed with their rear wall adjacent to a building wall, the air volume supply required for cooling devices of higher performance classes cannot be ensured with the arrangements known from the prior art.

The cooling device can have a cooling device housing with an air inlet side and/or an air outlet side which face the door element and are preferably arranged parallel to said door element, when the door element is in the closed position.

On its door inner side, which faces the cooling device in the closed position, the door element can have a sealing element, particularly a sealing frame, surrounding the air passage opening. Instead of the sealing frame, a foamed or extruded seal can also be provided. The sealing element can be dimensioned such that it seals the door inner side with respect to the border of the air outlet and/or the air inlet of the cooling device, when the door element is in the closed position.

It can further be provided that in the closed position, both the air outlet and the air inlet of the cooling device open into the air passage opening, wherein the air passage opening is designed in two parts with an air inlet opening, which opens into the air inlet of the cooling device, and an air outlet opening, which is fluidically separated from the air inlet opening and opens into the air outlet of the cooling device.

The air inlet opening and the air outlet opening can be fluidically separated from one another by a separator dividing the air passage opening, wherein the separator has a protruding partition, particularly a brush strip, on the door inner side which faces the cooling device in the closed position of the door element, and so an air short-circuit between air inlet and air outlet is prevented.

In addition, at least the air outlet opening can have an air guide geometry, particularly lamellas, which are designed to guide air escaping from the control cabinet housing via the air outlet opening in a direction facing away from the air inlet opening.

The air passage opening can be an air inlet opening or have such an air inlet opening which, downstream in the air flow direction through the air inlet opening, has an air filter, particularly a filter mat, facing the door inner side of the cooling device in the closed position of the door element. As a result, it can be prevented that the outer circle of the cooling device is contaminated with contaminants from the surroundings of the control cabinet arrangement.

The cooling device can be a horizontal slide-in device which is adjustable in a slide-in plane parallel to a roof side and/or a floor side of the control cabinet housing. Alternatively, the cooling device can be a vertical slide-in device which is adjustable in a slide-in plane parallel to a side wall of the control cabinet.

If the cooling device is a horizontal slide-in device, the cooling device can extend on its front side, which faces the door element, over the entire horizontal clearance of the control cabinet interior. If the cooling device is a vertical slide-in device, the cooling device can extend on its front side, which faces the door element, over the entire clear vertical installation dimension of the control cabinet interior.

In both cases, it can be provided that on its rear side, which faces a rear wall of the control cabinet housing, the cooling device has a bus bar transfer space designed as a horizontal opening through the cooling device. This embodiment is particularly advantageous, when the control cabinet arrangement is a component of a row of control cabinets, in which a multiplicity of control cabinet arrangements and/or control cabinet housings of the type in question form a row of control cabinets that are supplied with electric energy via a bus bar system which extends between the control cabinet housings through the adjacent sides of the individual control cabinet housings.

If the cooling device is a vertical slide-in device, it can be arranged adjacent to two lateral vertical profiles of a rack of the control cabinet housing, and so a control cabinet interior for receiving electronic components is delimited by a side wall of the cooling device facing away from said vertical profiles.

On the door side, the control cabinet housing can have a double-wing door arrangement, having a first door element, which has the air passage opening, and a second door element, which optionally closes the control cabinet interior, and so with an open first door element and a closed second door element, the cooling device can be adjusted between the slide-in position and the pull-out position. It is therefore ensured that, for example, in case of maintenance of the cooling device, the control cabinet interior fitted with possibly sensitive components does not have to be opened and is thus protected from unauthorized access.

It can further be provided that the vertical slide-in device extends in its depth direction parallel to the slide-in direction in the slide-in position essentially over the entire depth of the control cabinet interior, or at least aligns one front side of the housing of the vertical slide-in device with the door side of the control cabinet housing.

On an outer side of the door element, a device display of the cooling device can be arranged, wherein a connection cable of the device display is guided through the door element and emerges from the door element on a door inner side which faces the cooling device in the closed position of the door element, wherein on its front side facing the door element, the cooling device has a cable box for receiving the connection cable.

The cable box can have a cable entry, through which the connection cable emerging on the door inner side of the door element enters the cooling device, wherein the connection cable is preloaded in the direction of the cable entry. Preferably, the cable entry is arranged on a front side of the cooling device facing the door inner side of the door element. On a rear side facing away from the cable entry and located in the interior of the cooling device, the cable box can have a cable exit, through which the device cable emerges from the cable box and is guided to a control device of the cooling device.

The door element can be either a control cabinet door pivotably attached by means of hinges to the control cabinet housing, or a door panel mounted on a vertical housing side of the cooling device which faces the door side of the control cabinet housing in the slide-in position, wherein the panel is adjustable perpendicularly, i.e. linearly to the door side.

If the door element is a linearly adjustable door panel, it can be firmly connected to the housing side of the cooling device and have a handle on its outer side facing away from the cooling device, and so the cooling device with the door panel is adjustable between the slide-in position and the pull-out position.

Further areas of applicability will become apparent from the description provided herein. The description and specific examples in this summary are intended for purposes of illustration only and are not intended to limit the scope of the present disclosure.

BRIEF DESCRIPTION OF THE DRAWINGS

The drawings described herein are for illustrative purposes only of selected embodiments and not all possible implementations, and are not intended to limit the scope of the present disclosure.

Further details of the invention shall be explained using the following drawings.

DETAILED DESCRIPTION

Example embodiments will now be described more fully with reference to the accompanying drawings.

Figure 1:
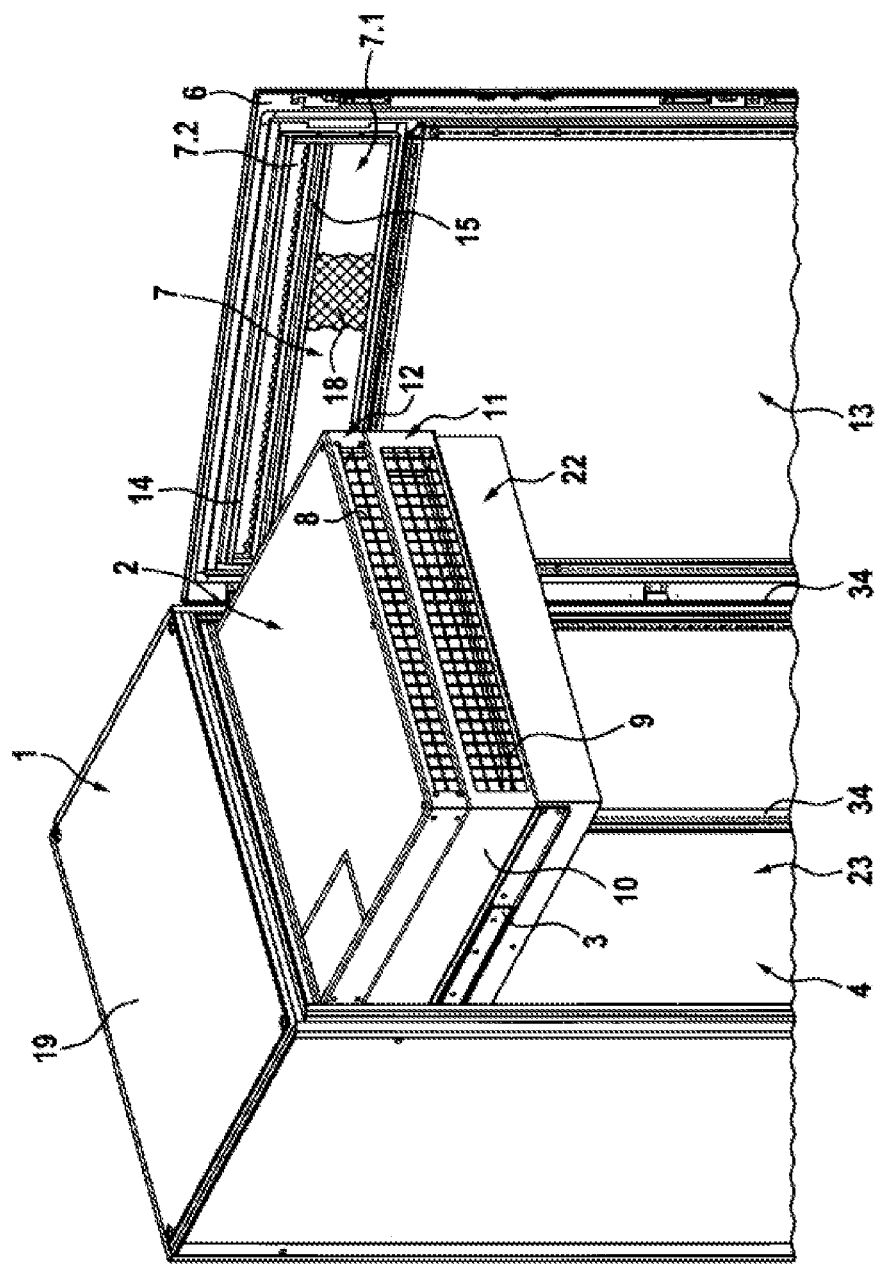
FIG. 1 shows the upper part of a control cabinet arrangement according to a first embodiment of the invention, wherein the cooling device is in a pull-out position.
Figure 3:
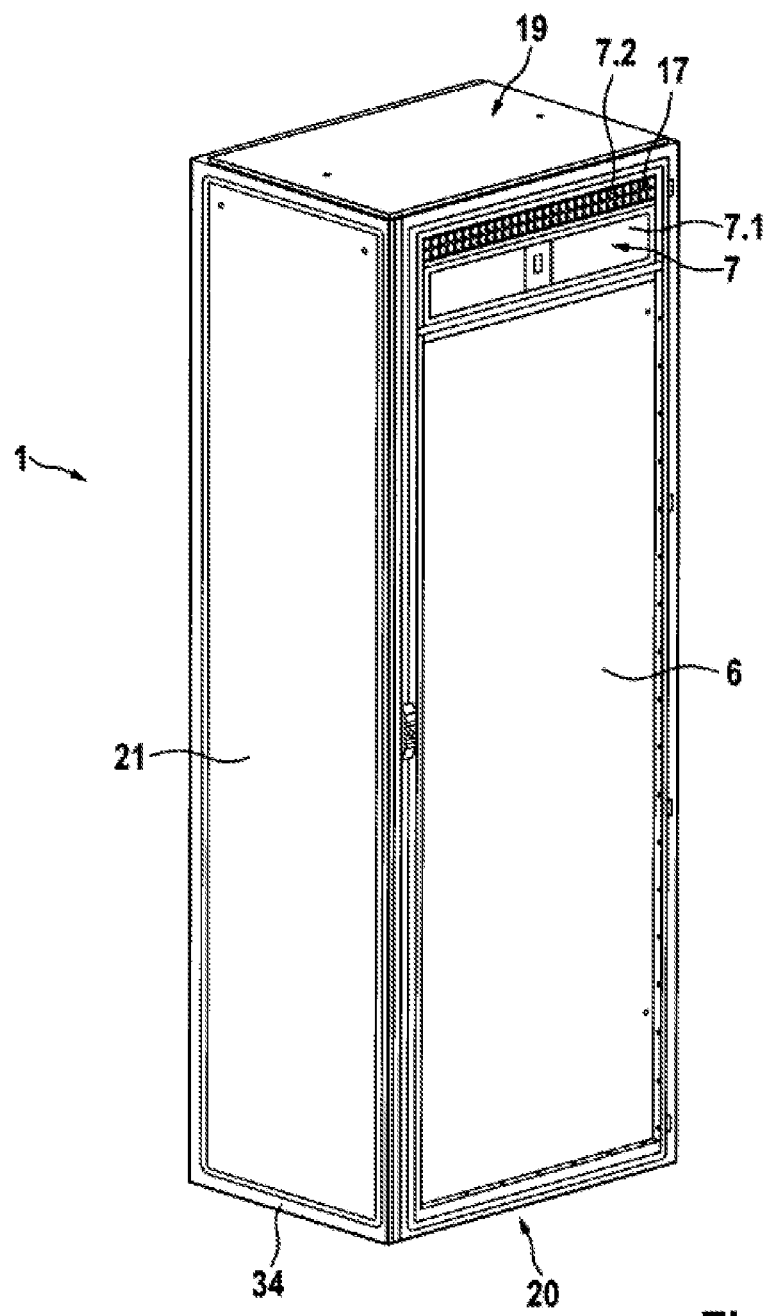
FIG. 3 shows the embodiment according to FIGS. 1 and 2, wherein the cooling device is in the closed position.

FIG. 1 shows an embodiment of the control cabinet arrangement 1 according to the invention, in which the cooling device 2 is designed as a horizontal slide-in device which is arranged in the upper area of the control cabinet interior 23 directly below the roof side 19 of the control cabinet 1 and extends essentially over the entire width of the control cabinet interior 23. The cooling device 2 is shown in its pulled-out position. By comparison, the view according to FIG. 3 shows the cooling device 2 in the inserted position. A linear adjusting unit 3 is provided in order to adjust the cooling device 2 back and forth between the two positions shown in FIGS. 1 and 3.

On a front side 22, the cooling device has an air outlet 8 and an air inlet 9, by means of which the outer circle of the cooling device 2 is fluidically connected to the surroundings of the control cabinet housing 1. The depiction according to FIG. 1 does not show the cooling air outlet arranged on the underside of the cooling device, i.e. on the side of the cooling device housing 10 facing the control cabinet interior 23, and the hot air inlet, by means of which the inner circle of the cooling device 2 is fluidically connected to the air in the control cabinet interior 23.

The control cabinet housing 1 has a door element 6 which is hinged to a vertical profile 34. In the upper area of the door element 6, an air passage opening 7 is formed which is divided by a separator 15 into an air inlet opening 7.1 and an air outlet opening 7.2. As can be seen in the combined view of FIGS. 1 and 2, the air inlet opening 7, in the closed position of the door element 6 shown in FIG. 2, opens into the air inlet 9 of the cooling device 2, and the air outlet opening 7.2 opens into the air outlet 8 of the cooling device 2. The air outlet 8 is formed on an air outlet side 12 of the cooling device 2, and the air inlet 9 is formed on an air inlet side 11 of the cooling device 2, wherein the air inlet side 11 and the air outlet side 12, in the closed position of the door element 6 shown in FIG. 3, are arranged parallel to the door inner side 13 of the door element 6.

Figure 2:
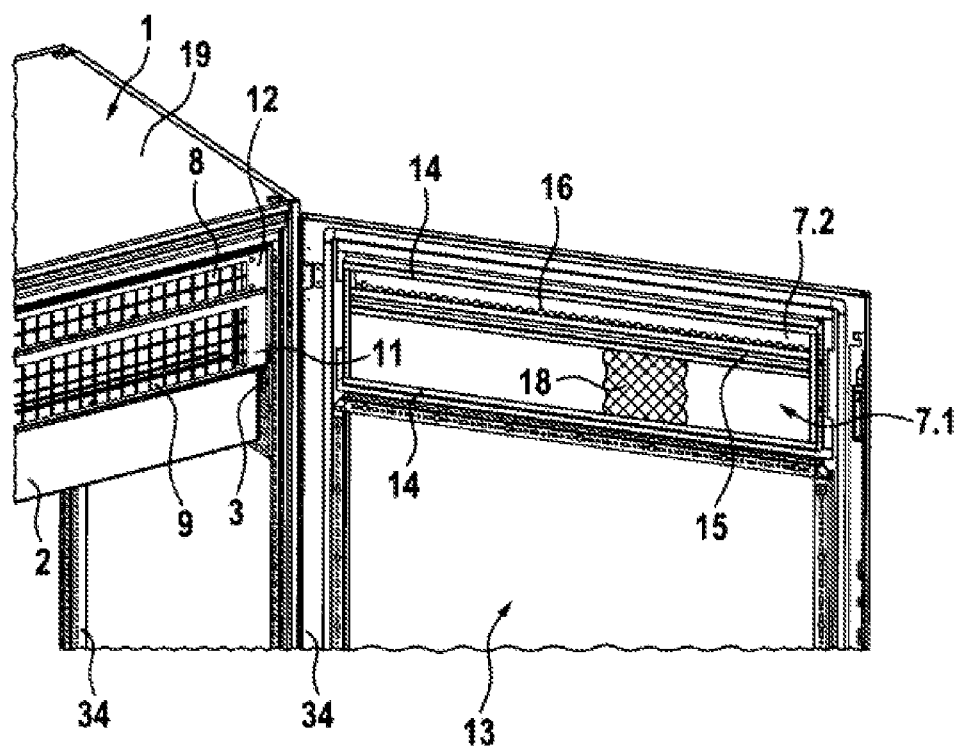
FIG. 2 shows the embodiment according to FIG. 1, wherein the cooling device is in the slide-in position.

On the door inner side 13, a sealing element 14 surrounding the air passage opening 7 is formed which bears sealingly against the air inlet side 11 and the air outlet side 12 in the longitudinal position of the door element 6 shown in FIG. 2. The sealing element 14 can be, for example, a continuously closed sealing lip.

In order to prevent an air short-circuit between the air inlet opening 7.1 and the air outlet opening 7.2, they are fluidically separated from one another by a separator 15. Furthermore, on the door inner side 13, a partition 16 in the form of a brush strip is arranged, the bristles of which extend perpendicularly to the door inner side 13, and in the closed position according to FIG. 3 thus prevent an air short-circuit between the air outlet 8 and the air inlet 9 or between the air inlet opening 7.1 and the air outlet opening 7.2. The air inlet opening 7.1 is covered by the door inner side 13 by means of an air filter 18 in the form of an air-permeable filter mat.

FIG. 3 shows that on the air outlet opening 7.2, an air guide geometry 17 is formed, by means of which the air emerging from the air outlet opening 7.2 is guided away from the air inlet opening 7.1.

Figure 4:
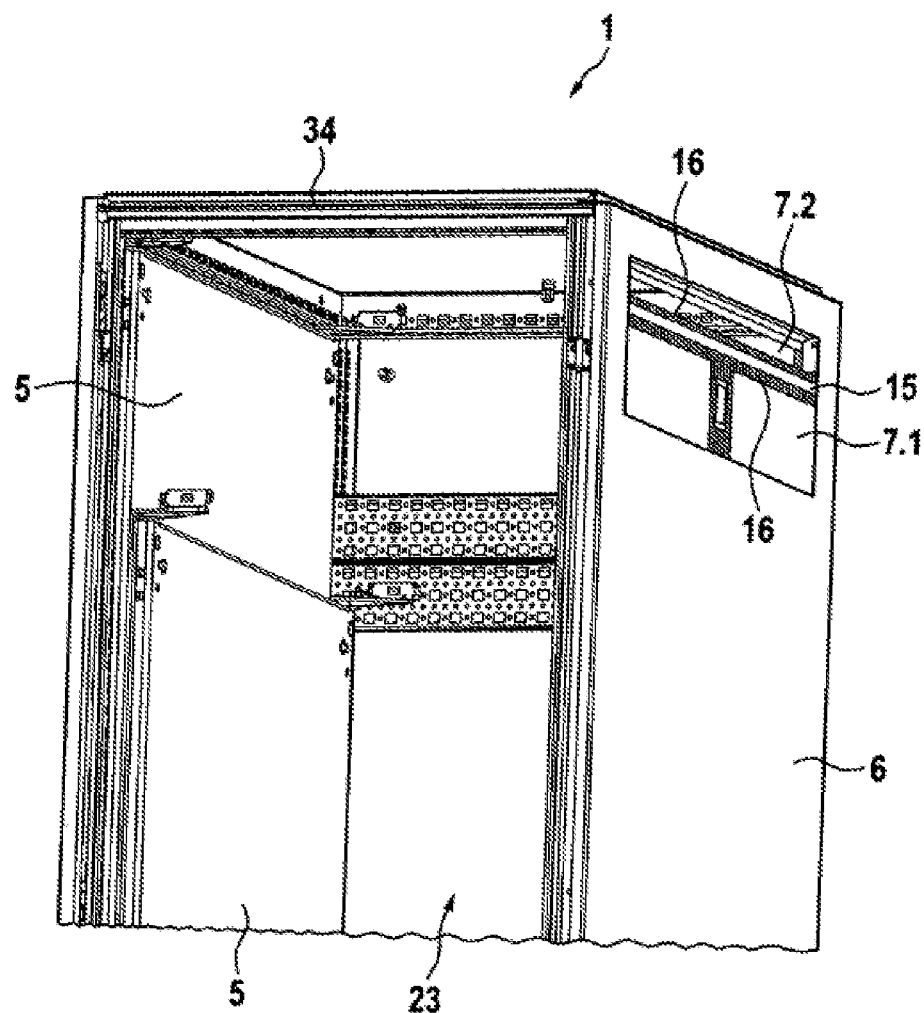
FIG. 4 shows the embodiment according to FIG. 3, wherein the cooling device and a sidewall are removed for better illustration.

FIG. 4 shows that in the control cabinet interior 23, despite the cooling device (not depicted) installed in the upper area, a mounting plate 5 can extend essentially over the entire height of the control cabinet interior 23. A further mounting plate 5 is arranged upstream of the aforementioned mounting plate 5 in the lower area of the control cabinet interior 23.

Figure 5:
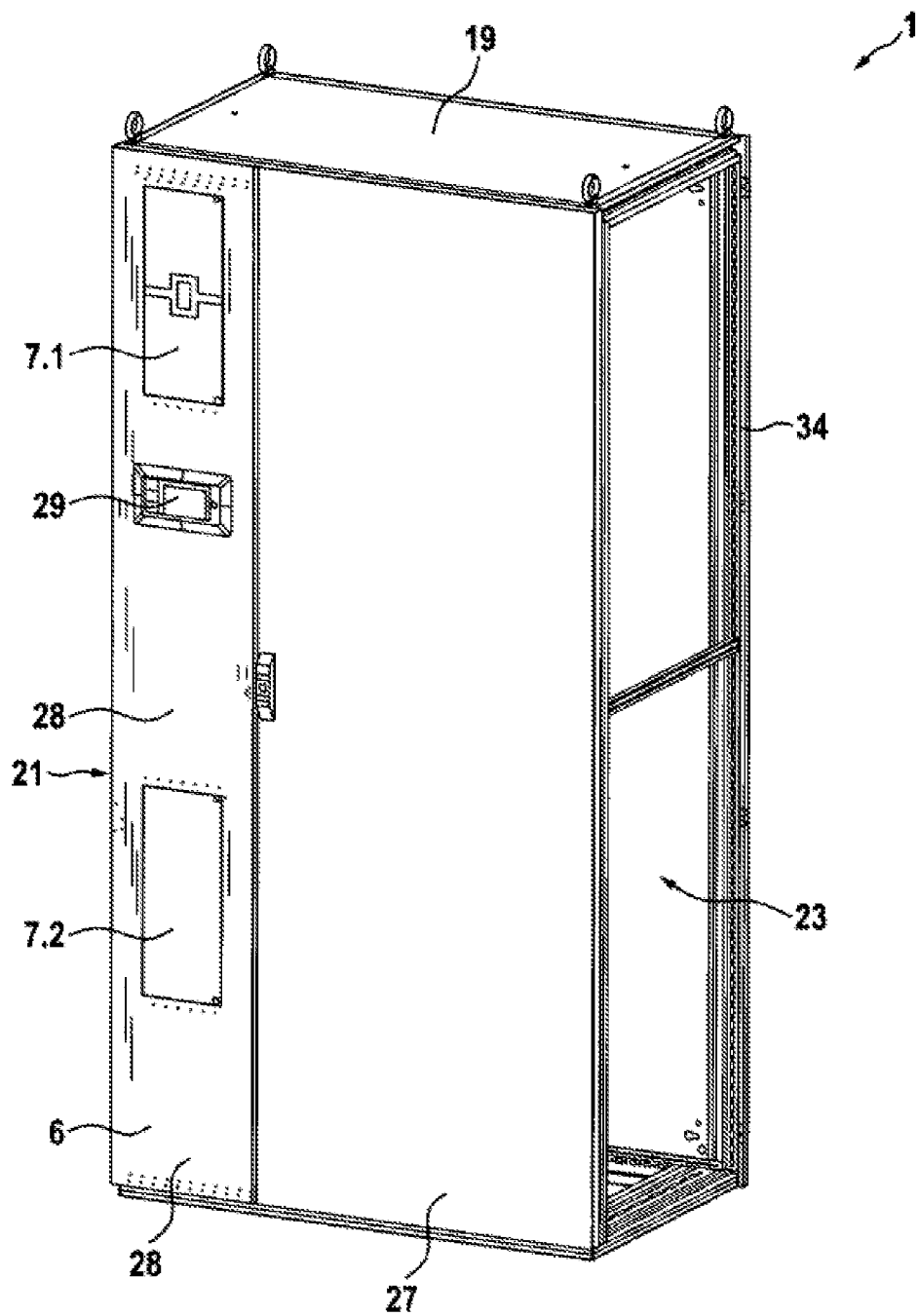
FIG. 5 shows a control cabinet arrangement according to a further embodiment of the invention.

FIG. 5 shows a further embodiment of the invention, in which the cooling device (not depicted) is designed as a vertical slide-in device. The control cabinet housing 1 has a first door element 6, by means of which the cooling device 2 can be accessed, and a second door element 27, by means of which the control cabinet interior 23 can be accessed. This control cabinet housing also has a rack 34, wherein the cooling device (not depicted) is arranged straight in a left area adjacent to a sidewall 21 of the control cabinet housing 1. Correspondingly, the vertical sidewall of the cooling device (not depicted), which faces away from the sidewall 21 of the control cabinet housing, delimits the control cabinet interior 23.

On the outer side 28, the door element 6 has the air inlet opening 7.1 in the upper area, and the air outlet opening 7.2 in a lower area. In an area lying in between, a device display 29 for operating the cooling device is arranged on the front side 28 of the door element 6.

Figure 6:
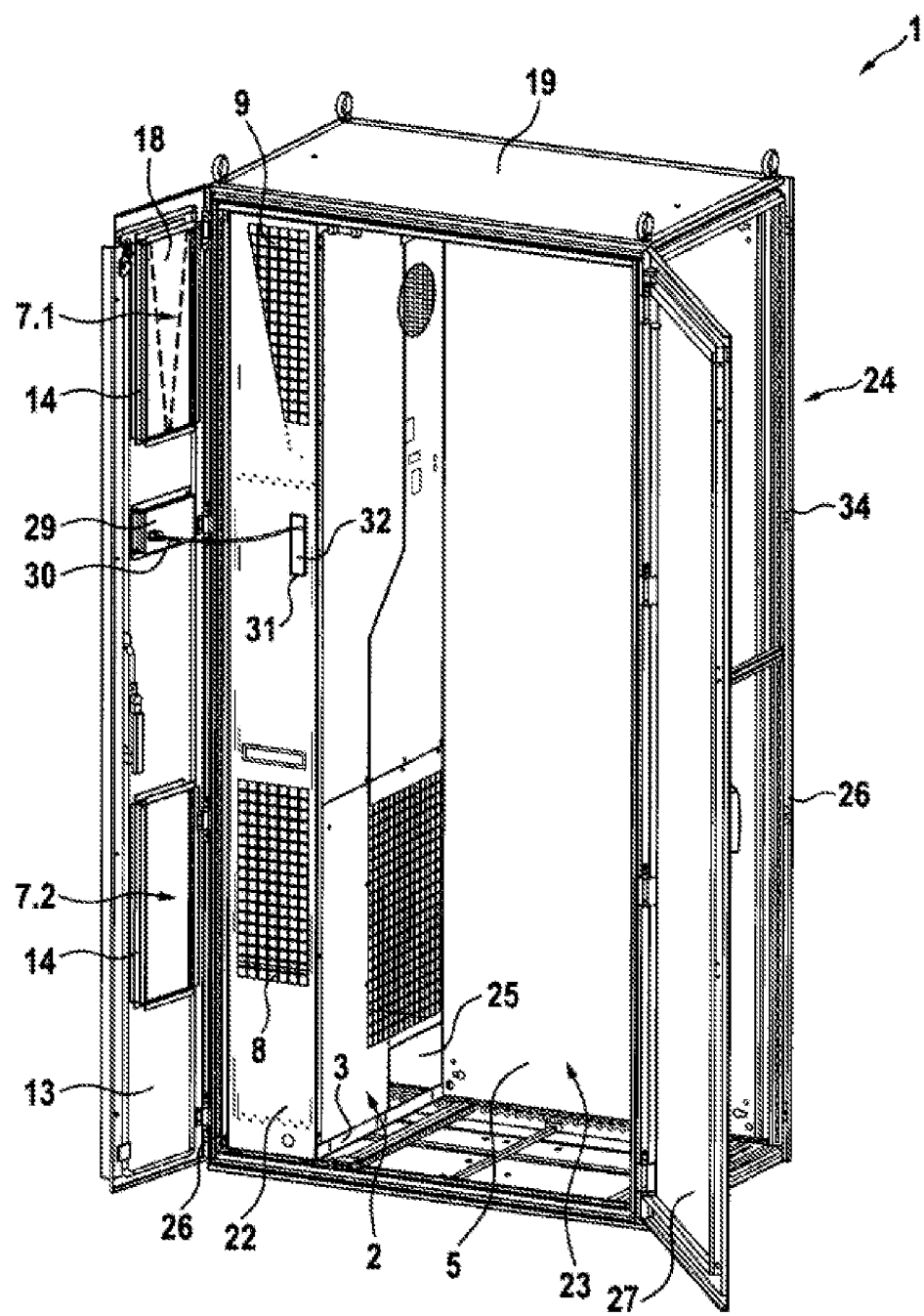
FIG. 6 shows the embodiment according to FIG. 5 with open door elements.
Figure 10:
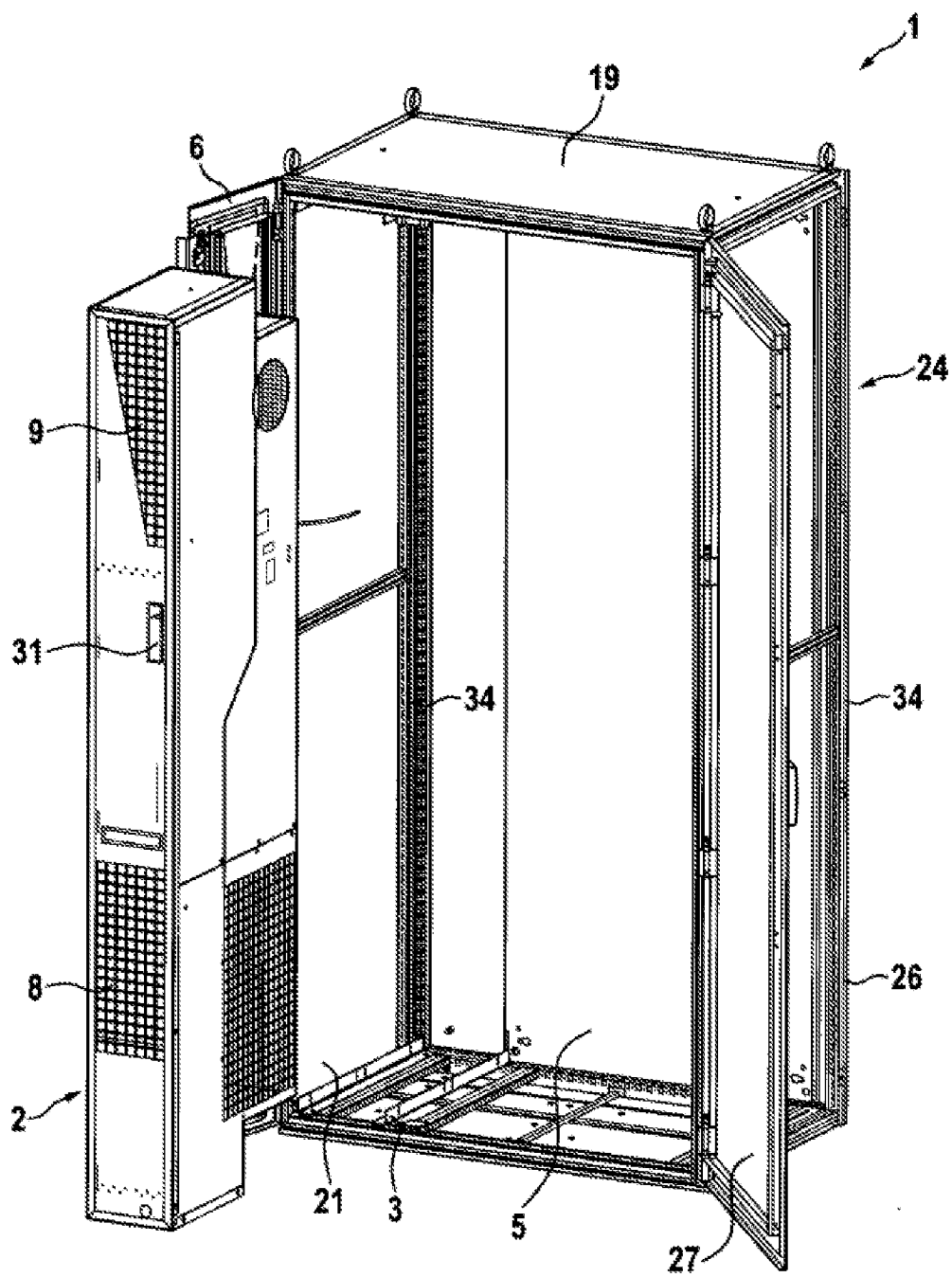
FIG. 10 shows the embodiment according to FIG. 6 with the cooling device removed.

FIG. 6 shows the control cabinet arrangement according to FIG. 5, wherein the two door elements 6, 27 are open, and the cooling device 2 and the control cabinet interior 23 are thus accessible. The cooling device 2 is inserted into the control cabinet housing 1 via a linear adjusting unit 3. As can be seen in FIG. 10, the linear adjusting unit 3 is essentially formed by two opposite, parallel L-profiles, on which the vertical cooling device 2 can be inserted into the control cabinet housing 1.

Once again, the cooling device 2, correspondingly to the openings 7.1, 7.2 in the door element 6, has an air outlet 8 and an air inlet 9. On the door inner side 13, sealing elements 14 are provided which surround the openings 7.1, 7.2, and so, in the closed position of the door element 6, they sealingly bear against the front side of the cooling device 2 which faces the door element 6, while surrounding the air outlet 8 or the air inlet 9.

It can further be seen that on the door inner side 13, the display 29 protrudes through the door element 6 and has a cable connection, from which a connection cable 30 extends from the device display 29 to a cable box 31 in the front side 22 of the cooling device 2. Via the cable box 31, the connection cable 30 is further guided to control electronics in the interior of the cooling device 2.

In the rear area, the cooling device 2 has in the inserted position shown in FIG. 6 a bus bar transfer space 25, and so in the modular situation, in which a plurality of the control cabinet housing 1 shown in FIG. 6 and/or further control cabinets form a row of control cabinets, bus bars can be guided through the row of control cabinets without interference by the cooling device 2.

Figure 7:
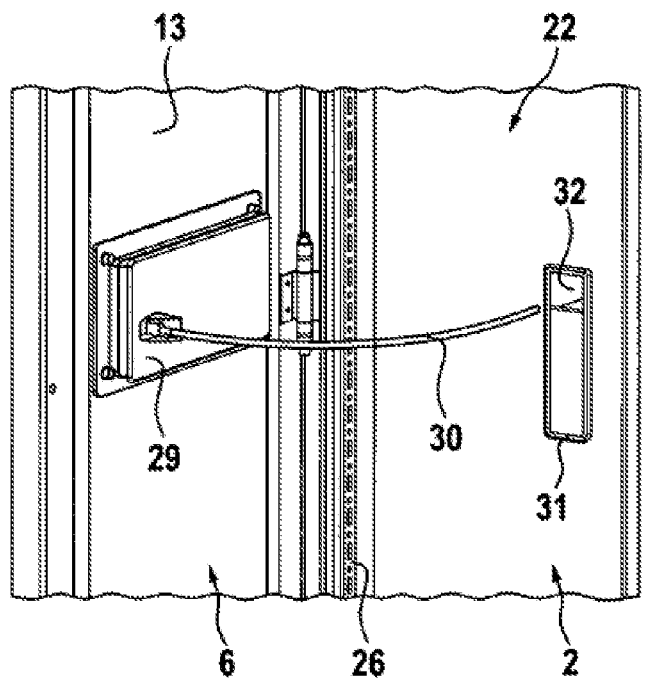
FIG. 7 shows a detailed view of the depiction according to FIG. 6.

FIG. 7 once again shows the connection of the device display in detail. On the door inner side, the device display 29 protrudes through the door element 6 and is connected to a cable box 31 via a connection cable 30. The cable box 31 is designed to receive the cable in the closed position of the door element 6 and to uncover it in the open adjustment position of the door element 6 shown in FIG. 7. For that purpose, a preloaded cable drum can be incorporated in the cable box 31.

Figure 8:
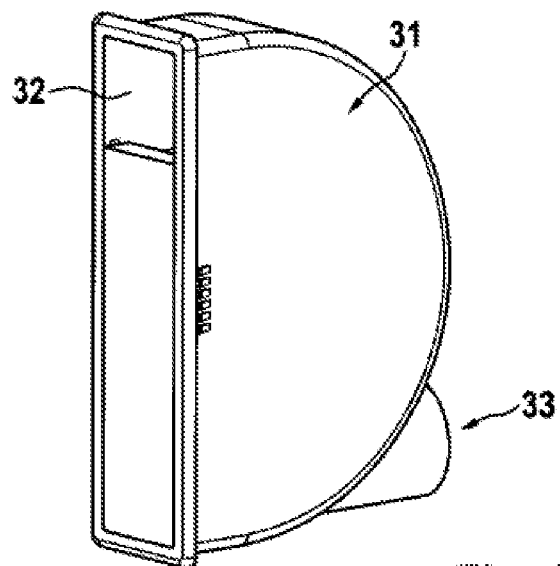
FIG. 8 shows an embodiment of a cable box.

The cable box 31 is shown in FIG. 8. On the front side, it has a cable entry 32, and on the rear side, it has a cable exit 33, through which the connection cable 30 (see FIG. 7) can emerge from the cable box 31 in order to be connected to control electronics of the cooling device.

Figure 9:
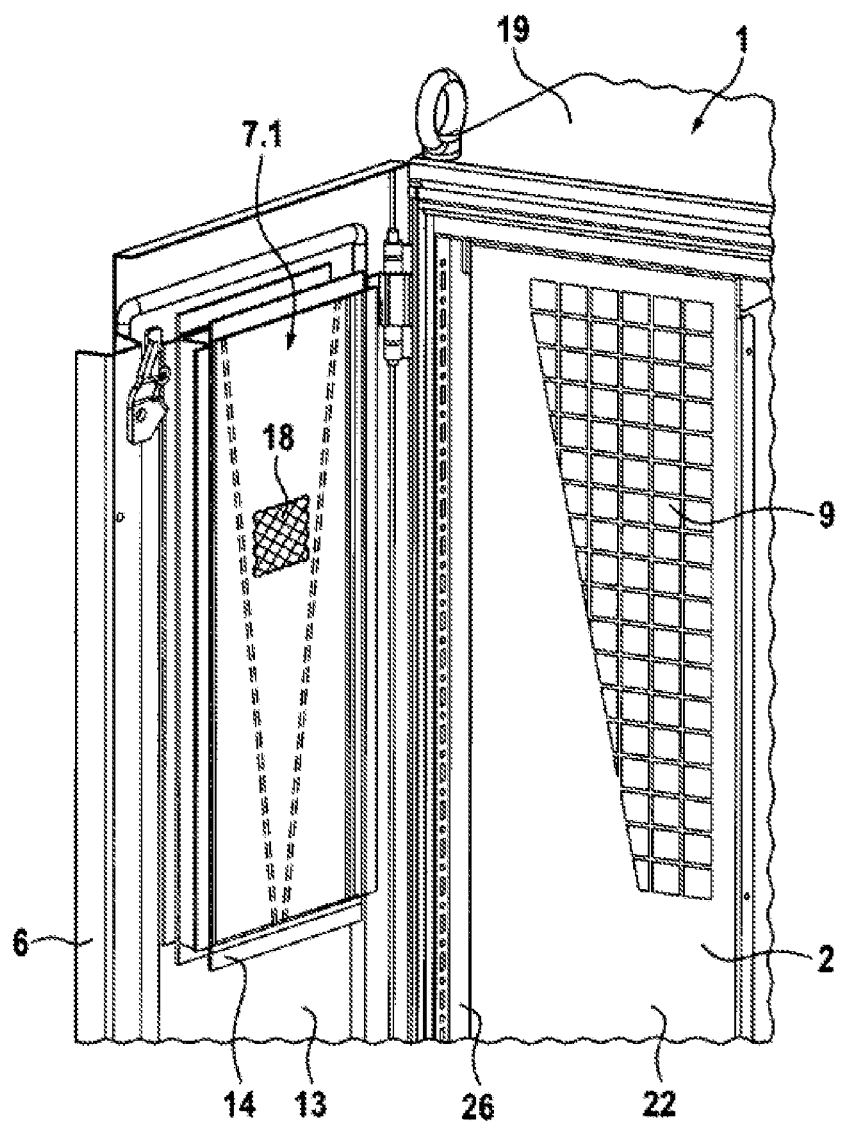
FIG. 9 shows a detailed view of the depiction according to FIG. 6.

The depiction according to FIG. 9 shows the upper area of the embodiment according to FIG. 6. A sealing element 14 surrounding the air inlet opening 7.1 is arranged on the door inner side 13 of the door element 6. In addition, on the door inner side 13, an air filter 18 in the form of a filter mat is arranged downstream of the air inlet opening 7.1 in fluid flow direction through the door element 6, said filter mat being surrounded by the sealing element 14. It can be seen that the sealing element 14 has external sealing flanges, with which it sealingly bears against the front side 22 of the cooling device 2, when the door element 6 is in the closed position, and only surrounds the air inlet of the cooling device 2.

In FIG. 10, the cooling device 2 is completely removed from the embodiment of the control cabinet housing 1 shown in FIGS. 5 to 9. As a result, the linear adjusting unit 3 in the form of two opposite L-profiles formed on the floor side of the control cabinet housing 1 can be seen. The L-profiles have fastening seats, and on the floor side, the cooling device has corresponding thread seats, and so in a defined arrangement between the L-profiles and the cooling device 2, the L-profiles can be screwed together with the cooling device 2.

Figure 11:
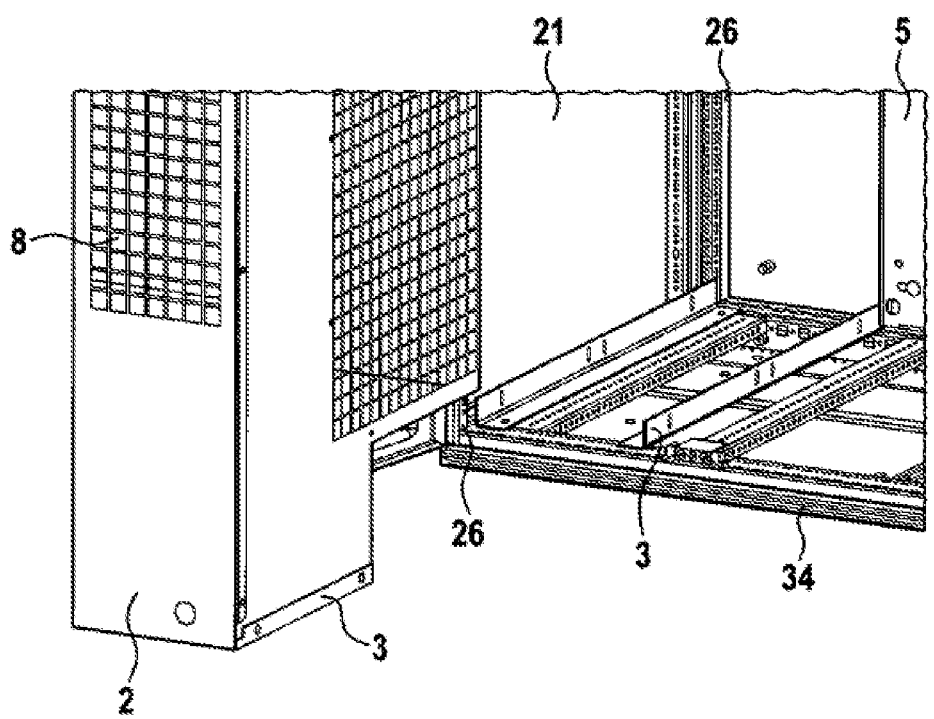
FIG. 11 shows a detailed view of the depiction according to FIG. 10.

The combined view of FIGS. 10 and 11 further shows that the L-profiles only reach two vertical profiles 26 which delimit a control cabinet side, and so the cooling device 2 can be received in a space-saving manner in the control cabinet housing 1 directly adjacent to the left sidewall 21 of the control cabinet housing 1 shown in FIG. 10; as a result, a largest possible control cabinet interior 23 remains for receiving electronic components.

Figure 12:
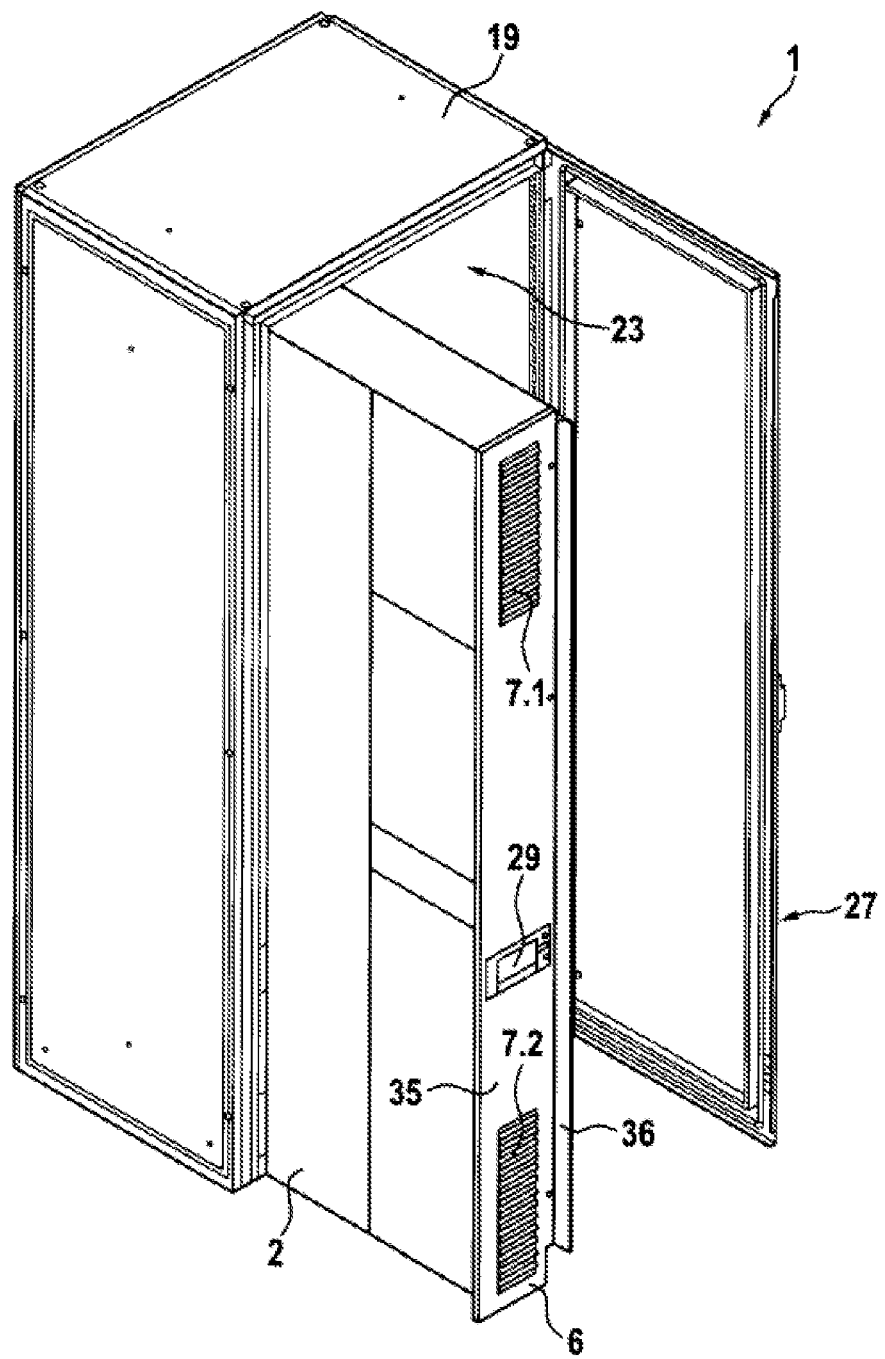
FIG. 12 shows an embodiment in which the door element is a door panel.

FIG. 12 shows a control cabinet arrangement which differs from the control cabinet arrangement shown in FIG. 6 in that the door element 6, instead of being a door hinged to the control cabinet housing 1, is a door panel 35 which can be adjusted perpendicularly to the door side 4, and which is mounted on a vertical housing side of the cooling device 2 which faces the control cabinet housing 1, when the door side 4 of the control cabinet housing 1 is in the slide-in position. The door panel 35 is firmly connected to the housing side of the cooling device 2, and has a handle 36 on its outer side facing away from the cooling device 2, and so the cooling device 2 with the door panel 35 is adjustable between the slide-in position and the pull-out position. The further door element 27 remains in order to be able to optionally close the control cabinet interior 23. In the depicted pull-out position, the cooling device 2 is not completely removed from the housing and also remains closed in this adjustment position with the closed further door element 27.

The features of the invention disclosed in the above description, in the drawing, and the claims can be essential for the realization of the invention both in isolation and in any combination.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. A control cabinet arrangement, comprising a cooling device which is received in a control cabinet housing, wherein the cooling device can be slidably held on the control cabinet housing via a linear adjusting unit, including a bar system, and can be adjusted between a pull-out position and a slide-in position, wherein the cooling device in the slide-in position is completely received in the control cabinet housing, and in the pull-out position, the cooling device protrudes at least partially beyond a door side of the control cabinet housing from the control cabinet housing, wherein a door element, which closes in its closed position the door side of the control cabinet housing, comprises at least one air passage opening which opens into an air outlet and/or an air inlet of the cooling device at least in the closed position of the door element, when the cooling device is in the slide-in position, and a sealing element on an inner side of the door element, the sealing element completely surrounding the air passage opening, the air passage opening including both the air inlet opening and the air outlet opening, the air inlet opening is opposite to the air inlet of the cooling device when the door element is closed, and the air outlet opening is opposite to the air outlet of the cooling device when the door element is closed;
wherein the cooling device has a cooling device housing with an air inlet side and an air outlet side that face and are arranged parallel to the door element when the door element is in the closed position;
wherein in the closed position, both the air outlet and the air inlet of the cooling device open into the air passage opening;
wherein the air passage opening is designed in two parts with an air inlet opening, which opens into the air inlet of the cooling device, and an air outlet opening, which is fluidically separated from the air inlet opening and opens into the air outlet of the cooling device.

2. A control cabinet arrangement according to claim 1, in which the air inlet opening and the air outlet opening are fluidically separated from one another by a separator dividing the air passage opening, wherein the separator has a protruding partition, including a brush strip, on the door inner side which faces the cooling device in the closed position of the door element, and so an air short-circuit between air inlet and air outlet is prevented.

3. A control cabinet arrangement according to claim 1, in which at least the air outlet opening has an air guide geometry, including lamellas, which are designed to guide air escaping from the control cabinet housing via the air outlet opening in a direction facing away from the air inlet opening.

4. A control cabinet arrangement according to claim 1, in which the air passage opening is or has an air inlet opening which, downstream in the air flow direction through the air inlet opening, has an air filter, including a filter mat, facing the door inner side of the cooling device in the closed position of the door element.

5. A control cabinet arrangement according to claim 1, in which the cooling device is a horizontal slide-in device which is adjustable in a slide-in plane parallel to a roof side and/or a floor side of the control cabinet housing, or in which the cooling device is a vertical slide-in device which is adjustable in a slide-in plane parallel to a side wall of the control cabinet.

6. A control cabinet arrangement according to claim 5, in which the cooling device,
a) if it is a horizontal slide-in device, extends on its front side, which faces the door element, over the entire horizontal clearance of the control cabinet interior, and
b) if it is a vertical slide-in device, extends on its front side, which faces the door element, over the entire clear vertical installation dimension of the control cabinet interior,
wherein on its rear side, which faces a rear wall of the control cabinet housing, the cooling device has a bus bar transfer space designed as a horizontal opening through the cooling device.

7. A control cabinet arrangement according to claim 1, in which the door element is either a control cabinet door pivotably attached by means of hinges to the control cabinet housing, or a door panel mounted on a vertical housing side of the cooling device which faces the door side of the control cabinet housing in the slide-in position, and which is adjustable perpendicularly to the door side.

8. A control cabinet arrangement according to claim 7, in which the door panel is firmly connected to the housing side of the cooling device and has a handle on its outer side facing away from the cooling device, and so the cooling device with the door panel is adjustable between the slide-in position and the pull-out position.

9. The control cabinet arrangement according to claim 1, wherein each one of the air outlet and the air inlet of the cooling device extends laterally across the cooling device opposite to a width of the door element when the door element is closed.

10. The control cabinet arrangement according to claim 1, wherein the air inlet of the cooling device is larger than the air outlet of the cooling device.

11. A control cabinet arrangement, comprising a cooling device which is received in a control cabinet housing, wherein the cooling device can be slidably held on the control cabinet housing via a linear adjusting unit, including a bar system, and can be adjusted between a pull-out position and a slide-in position, wherein the cooling device in the slide-in position is completely received in the control cabinet housing, and in the pull-out position, the cooling device protrudes at least partially beyond a door side of the control cabinet housing from the control cabinet housing, wherein a door element, which closes in its closed position the door side of the control cabinet housing, comprises at least one air passage opening which opens into an air outlet and/or an air inlet of the cooling device at least in the closed position of the door element, when the cooling device is in the slide-in position;

wherein the cooling device has a cooling device housing with an air inlet side and an air outlet side, which, at least in the closed position of the door element, face and are preferably arranged parallel to the door element;

wherein in the closed position, both the air outlet and the air inlet of the cooling device open into the air passage opening, wherein the air passage opening is designed in two parts with an air inlet opening, which opens into the air inlet of the cooling device, and an air outlet opening, which is fluidically separated from the air inlet opening and opens into the air outlet of the cooling device; and wherein an outer side of the door element, a device display of the cooling device is arranged, wherein a connection cable of the device display is guided through the door element and emerges from the door element on a door inner side which faces the cooling device in the closed position of the door element, wherein on its front side facing the door element, the cooling device has a cable box for receiving the connection cable.

12. The control cabinet arrangement according to claim 11, wherein the cable box has a cable entry, through which the connection cable emerging on the door inner side of the door element enters the cooling device, wherein the connection cable is preloaded in the direction of the cable entry.

* * * * *